United States Patent

Rorick et al.

[15] 3,670,693

[45] June 20, 1972

[54] QUARTZ CRYSTAL RESONATOR TUNING CONTROL APPARATUS

[72] Inventors: William G. Rorick, Costa Mesa; Herbert O. Lewis, Westminster, both of Calif.

[73] Assignee: Collins Radio Company, Dallas, Tex.

[22] Filed: March 23, 1971

[21] Appl. No.: 127,270

[52] U.S. Cl. ........................................118/5, 118/8, 118/49

[51] Int. Cl. ........................................C23c 11/12

[58] Field of Search ........................................118/48–49.5, 7, 118/8, 5; 117/DIG. 2; 310/8.1

[56] References Cited

UNITED STATES PATENTS

| | | | |
|---|---|---|---|
| 2,621,624 | 12/1952 | Chilowsky | 118/49 X |
| 3,157,535 | 11/1964 | Radke | 118/7 |
| 3,382,842 | 5/1968 | Steckelmacher et al. | 118/8 |
| 3,383,238 | 5/1968 | Unzicker et al. | 118/49 X |
| 3,609,415 | 9/1971 | Kawada | 310/8.1 |

*Primary Examiner*—Morris Kaplan
*Attorney*—Warren H. Kintzinger and Robert J. Crawford

[57] ABSTRACT

A quartz crystal resonator tuning plating automatic control process utilizing an automatic feedback control circuit in a process loop with the quartz crystal being metal plating tuned in an oscillator circuit. The frequency of the oscillator circuit is mixed with a reference frequency and the difference frequency is converted to dc applied to an RC circuit connected to a power amplifier for developing an exponential power output response from the power amplifier that melts and vaporizes plating metal (such as gold) in a vacuum chamber. This results in the plating rate on the quartz crystal being tuned processed tapering off from a much higher rate to a very low plating rate as the desired tuned frequency is approached. Minimum power level and shutoff controls are provided for the power amplifier in attaining desired levels of product frequency adjustment and plating cutoff.

6 Claims, 2 Drawing Figures

Figure 1:
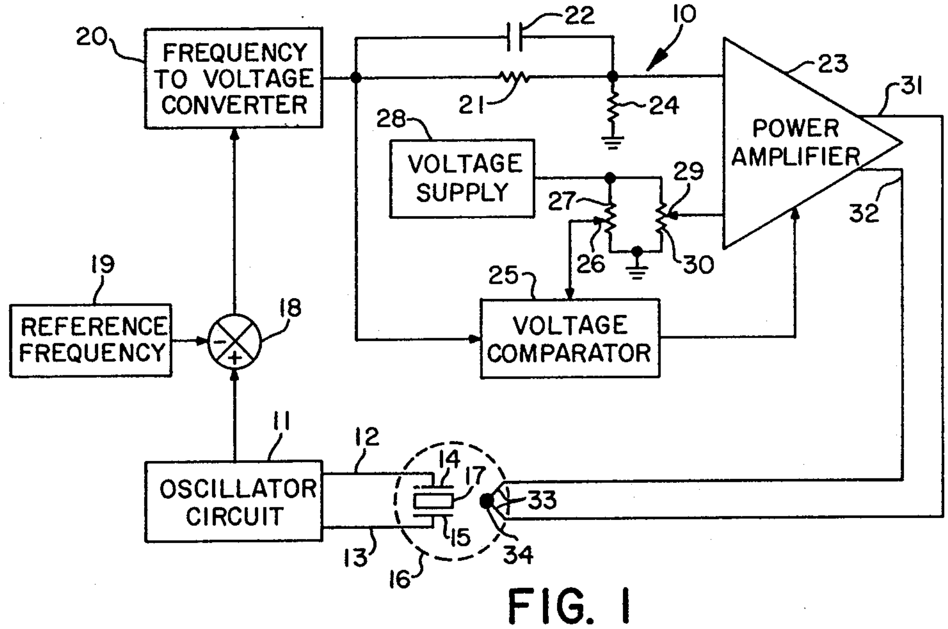

INVENTORS
WILLIAM G. RORICK
HERBERT O. LEWIS
BY Warren H. Kintzinger
ATTORNEY

QUARTZ CRYSTAL RESONATOR TUNING CONTROL APPARATUS

This invention relates in general to frequency tuning of quartz crystals and, in particular, to quartz crystal resonator feedback tuning control of crystal metal plating rate and shutoff.

Control of metal plating rate and shutoff in final frequency tuning of quartz crystals has, generally, heretofore been accomplished manually with, as a result, yield and plating time varying more than desired since both are highly dependent on an operator's skill. Furthermore, overshoot in system crystal plating shutoff is more likely to be a problem with manual control.

It is, therefore, a principal object of this invention to provide automatic crystal frequency plating control.

Another object is for product yield and plating time optimization independent of operator skill.

A further object is for plating rate and crystal frequency, in an oscillator circuit, to be reduced at an exponential rate to a predetermined very low rate just prior to shutoff.

Features of the invention useful in accomplishing the above objects include, in a quartz crystal resonator tuning plating control process, an automatic feedback control circuit for final tuning plating control of individual quartz crystals in an oscillator circuit to close tolerances, for example approximately 2 PPM as translated to finished plating. The tuning is accomplished by vacuum deposition of gold (or another suitable metal) on conductive surfaces of crystals. The gold (or other metal) is evaporated from a heated filament wire at a rate determined by feedback control. This is with the rate of frequency shift reduced exponentially from an initially relatively high rate to a very slow rate approximating 1 PPM/sec., as translated to metal plating, as the target frequency is approached. Then when the target frequency is sensed, power to the gold evaporation filament is abruptly shut off with the gold quickly cooling below significant evaporation temperature in less than one second. Obviously, this results in an overshoot factor of less than 1 PPM.

A specific embodiment representing what is presently regarded as the best mode of carrying out the invention is illustrated in the accompanying drawing.

Figure 2:
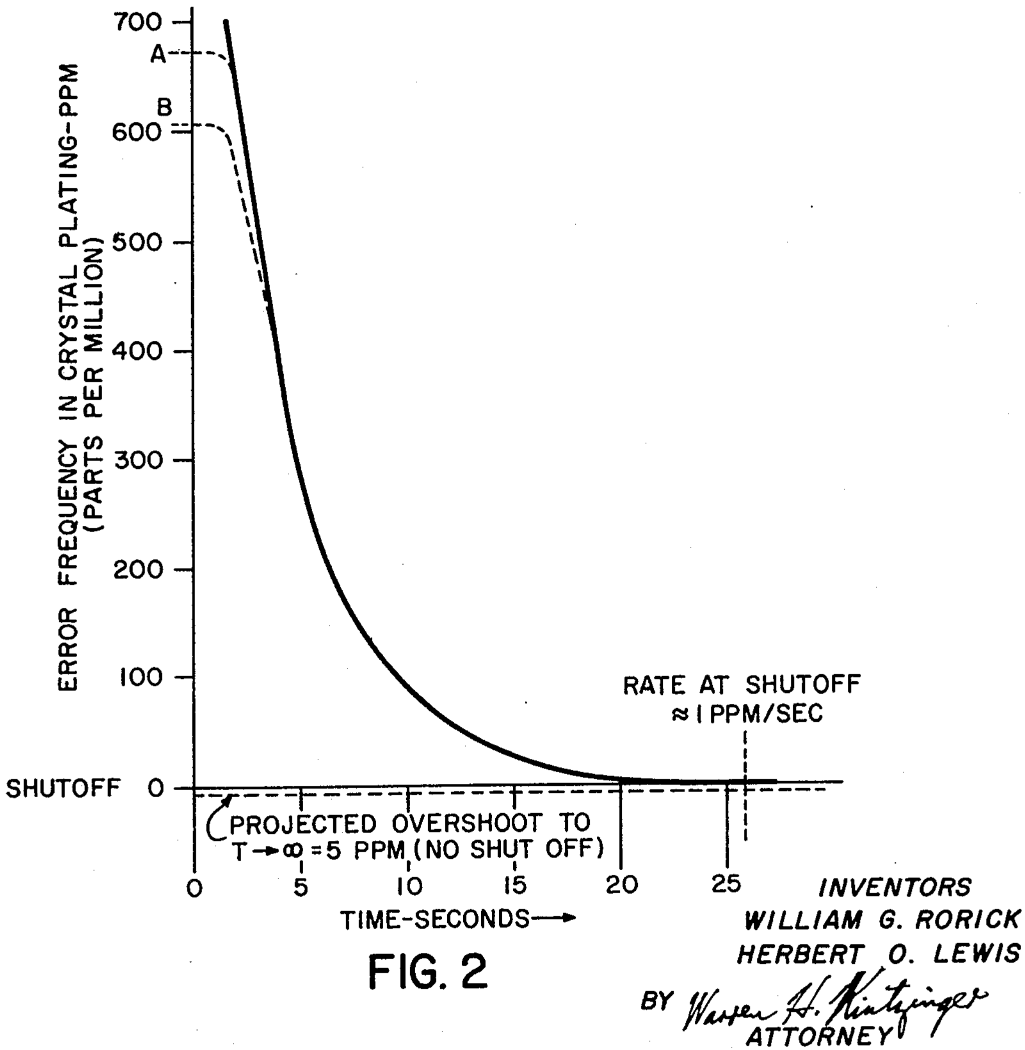

In the drawing:

FIG. 1 represents a combination block-schematic of applicants' quartz crystal metal plating resonator feedback tuning control circuit; and FIG. 2, an error frequency determined plating rate to time curve illustrating plating control characteristics.

The quartz crystal metal plating resonator feedback tuning control circuit 10 of FIG. 1 is shown to have an oscillator circuit 11 with connective lines 12 and 13 extending to crystal holding contact terminals 14 and 15 within a vacuum chamber 16 between which a raw unplated crystal 17, to be tuned by metal plating, is placed. The frequency output of the oscillator circuit that varies in frequency, with accumulated metal plating of the crystal 17, starting from a higher frequency at the raw unplated state to the finished tuned plated state is connected as an input to a frequency mixer 18 that also receives a predetermined highly accurate reference frequency input from reference frequency source 19. The output of mixer 18 as an audio difference frequency is connected as an input to frequency to voltage converter circuit 20. The dc output of frequency to voltage converter circuit 20 is connected through resistor 21 and capacitor 22, in parallel, as an input to power amplifier circuit 23. This is with, however, the common junction of resistor 21, capacitor 22 and the power amplifier 23 being connected through resistor 24 to ground. Furthermore, the output of frequency to voltage converter circuit 20 is also connected as an input to a voltage comparator circuit 25 having an output connected as a shutoff control input to power amplifier 23. The other input of voltage comparator circuit 25 is an adjustable tap contact 26 of a resistor 27 connected between voltage supply 28 and ground. A final rate adjustment input to the power amplifier 23 is provided by tap contact 29 of a resistor 30 also connected between voltage supply 28 and ground. The power amplifier 23 is two wire 31 and 32 output connected to a filament wire 33 within the vacuum chamber 16 for heating a supply of gold 34 to a molten and vaporizing state.

Actually the raw unplated crystal 17 to be tuned is indexed into position where it is connected to the oscillator circuit 11 as part of the feedback loop of the oscillator circuit 11. An audio difference frequency is obtained out of mixer 18 by mixing the precision preselected reference frequency from reference frequency 19 and the oscillator circuit 11 output frequency. The audio frequency is converted to a corresponding dc voltage, in frequency to voltage converter 20, and this resulting dc voltage is effectively connected in series with an exponential rate reference voltage stored on capacitor 22. The error voltage representing the difference between the frequency to voltage converter dc output and the voltage across capacitor 22 is applied to a current power amplifier 23 that provides current for heating a filament wire to melt and vaporize gold 34 in vacuum chamber 16. With this operational process the difference frequency from the oscillator and mixer in developing a dc output from the frequency to voltage conveter circuit 20 charges capacitor 22 through resistor 24. The voltage impressed across, or developed across, resistor 24 very quickly reaches the value determined by the ratio of resistor 21 to resistor 24. Power amplifier 23 includes a current limiting feature (circuit detail not shown) with the initial error voltage developed across resistor 24 being sufficient to drive the current power amplifier 23 to the limiting condition. The current flow from the power amplifier via lines 31 and 32 and passed through filament 33 quickly heats the gold to a temperature above evaporation cutoff; that is, the temperature at which metal evaporation begins to occur at a perceptible rate. Then, as temperature continues to increase the rate of gold evaporation with decrease of frequency as plating occurs on crystal 17 becomes sufficient such that the rate of voltage decrease, as a dc voltage out of frequency to voltage converter circuit 20, equals the freewheeling rate of discharge of capacitor 22 through resistor 21 to thereby reduce the error voltage to a relatively very small value bringing the power amplifier circuit 23 out of the limiting state of operation.

If no response delays or phase shifts were inherent in operation of the frequency to voltage converter 20 and/or in the capacitor 22 and resistor 24 circuitry, the frequency would very closely track the exponential decaying voltage of the resistor 21 and capacitor 22 parallel circuit. This is with the very small difference error voltage being at all times just sufficient to insure the required filament current out of power amplifier 23. However, a high degree of filtering is provided in the frequency to voltage converter circuit 20 to reduce ripple content in the dc output to an acceptable level. It should be noted, however, that at some low frequency phase shift around the loop becomes 180° thereby causing the system to go into an oscillating state with filament current repeatedly switching from zero to limiting at approximately a 3 Hz rate. This condition results in the plating rate being made to alternate about the ideal exponential rate established by resistor 21 and capacitor 22. However, loop gain is sufficiently high and filament time constant sufficiently long as compared to the frequency of instability that actual deviation from the ideal exponential rate, illustrated in the plating rate to time curve of FIG. 2, is not severe with peak deviation estimated to be approximately 30 percent at most. Then when the frequency and thereby the dc output of the frequency to voltage converter each reach a respective predetermined value, output of the voltage comparator 25 semiabruptly switches the amplifier to the off state completing the tuning cycle.

Thus, the plating rate is controlled such that the crystal frequency is reduced at an exponential rate to a predetermined very low rate just prior to shutoff with removal of heater filament power so that an insignificant amount of overshoot is experienced during gold cool-down within an interval of approximately 1-second with a rate of plating of the crystal at shutoff approximately only 1 part per million per second. It is of interest to note that the minimum possible controlled time constant is slightly greater than the greatest thermal time constant as related to cool-down of the filament wire and the gold reservoir with this affected to some degree by the amount of gold in the reservoir subject to heating. Should the minimum possible controlled time constant be less or shorter than the greatest thermal time constant the system could be caused to overshoot to a greater degree than is desired. Note that system operational oscillations of about 3 Hz that occur due to excessive phase shift in the frequency to voltage converter circuit 20 may be eliminated through replacement of the frequency to voltage converter circuit with a frequency discriminator operated at a higher frequency, and by also reducing the capacitor 22 and resistor 24 product. Note that, while this disclosure has been described primarily with the use of gold as the plating metal deposited on crystals in the tuning process described, the teachings hereof are applicable to any other metal that may be so used for crystal tuning.

Referring again to FIG. 2 note that the ideal exponential plating curve as shown with the continuous line is provided by the formula:

$$\frac{f_t-\Delta}{f_s}=\epsilon-t/T$$

where $f_s$ = starting frequency error $f_t$ = error at time $t$ $\Delta$ = projected error at $t \rightarrow \infty$ (−5 PPM) and $T=R_{21}C_{22}=5$ seconds Then for decay from, for example, a plating rate of 1,000 parts per million (PPM) at a raw unplated crystal frequency higher than the desired finished crystal product frequency, to shutoff (5 PPM above projected overshoot):

$$f_t=(0-\Delta)/f_s=5/1{,}000=1/200 \text{ (with } f_t \text{ at } t=0)$$

$$t=(\mathrm{Log}_\epsilon\ 10)\ T\ \mathrm{Log}\ (\Delta)/f_s=26 \text{ seconds}$$

Dashed Curve A of FIG. 2 illustrates the effect of delay during filament warm-up; while dashed Curve B illustrates the effect of delay during filament warm-up followed by amplifier limiting with both the curves ultimately blending to the ideal exponential plating curve as frequency reduces from the initial frequency with process plating of the crystal in the tuning process as desired.

Referring again to FIG. 1 the system circuit 10 for processing tuned plating oscillators 17 has been made to work quite satisfactorily with the output of the oscillator circuit 11 and the reference frequency input from reference frequency source 19 resulting in the frequency voltage converter dc output voltage to vary from a 15 volt maximum down to 1.5 volts at shutoff. This is with the varying dc voltage applied to the exponential determining RC circuit, with resistor 21 a 68 K Ohm resistor and capacitor 22 a 68 microfarad capacitor, giving an RC time constant of approximately 5 seconds. The resistor 24 is a 1 K Ohm resistor with a rate error voltage developed thereover of 7 millivolts for the amplifier limit, that is, equal to converter circuit 20 output minus the exponential rate reference voltage. The power amplifier 23 was provided with a gain equal to 2.2 amps per millivolt with the final rate adjustment of the tap 29 on resistor 30 set for 8 amps filament current at a frequency plating rate of 5 PPM below shutoff. This is with shutoff controlled by the setting of tap 26 on resistor 22 for shutoff at 100 Hz on a 1 kHz scale. The power amplifier 23 is set for a maximum plating power output rate of 16 amps limit output ranging down to an 8 amp output resulting in a plating rate equal to zero.

Whereas this invention is herein illustrated and described with respect to a single specific embodiment thereof, it should be realized that various changes may be made without departing from the essential contributions to the art made by the teachings hereof.

We claim:

1. In a metal plating tuning control process, apparatus for metal plating tuning of quartz crystals including: a quartz crystal metal plating chamber; an oscillator circuit with terminals for receiving a quartz crystal to be metal plate tune processed within said chamber; a reference frequency source; circuit means connected to receive frequency inputs from both said reference frequency source and said oscillator circuit and developing a dc output from the difference between the frequencies of said reference frequency source and the oscillator circuit; a power amplifier with dc input means developing a power output dependent on dc level input; RC time constant circuit means connected to receive said dc output and connected to said dc input means of said power amplifier; a plating metal supply in said chamber; metal melting and vaporizing heating means in said chamber for said plating metal supply; circuit means connecting the power output of said power amplifier to said heating means whereby tune plating of a crystal being plating tune processed is an exponential function tapering off from a high plating rate to a low plating rate as the desired crystal tuned frequency is approached a voltage comparator connected to a first dc voltage reference source and to said dc output as input connections; said voltage comparator having an output connection to a shutoff input of said power amplifier; and a second dc voltage reference source connected as a final rate reference input to said power amplifier.

2. In apparatus for the metal plating tuning of quartz crystals of claim 1, wherein said RC time constant circuit means includes parallel connected capacitive means and resistive means; and a resistor connected between the junction of said RC time constant circuit means and the dc input means of said power amplifier and ground.

3. In apparatus for the metal plating tuning of quartz crystals of claim 1, wherein at least one of said first and second dc voltage reference sources is in the form of an adjustable tapped voltage divider connected between a voltage supply and a voltage potential reference source.

4. In apparatus for the metal plating tuning of quartz crystals of claim 3, wherein said chamber is a vacuum chamber.

5. In apparatus for the metal plating tuning of quartz crystals of claim 4, wherein said heating means is heating filament wire; and said plating metal is gold.

6. In apparatus for the metal plating tuning of quartz crystals of claim 5 adjustment means controlling the plating rate from an initial rate in the hundreds of parts per million per second to approximately 1 part per million per second at shutoff.

* * * * *